United States Patent
Chi et al.

(10) Patent No.: US 7,294,579 B1
(45) Date of Patent: Nov. 13, 2007

(54) METHOD FOR FORMING CONTACT OPENING

(75) Inventors: Ying-Chou Chi, Taichung County (TW); Rong-Duo Wang, Taoyuan County (TW); Ying-Tsung Tu, Taoyuan County (TW); Chao-Huan Hsu, Taoyuan County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/308,872

(22) Filed: May 18, 2006

(51) Int. Cl.
*H01L 21/311* (2006.01)
(52) U.S. Cl. .................. 438/700; 438/715; 438/736; 438/623; 438/694; 438/780; 438/781
(58) Field of Classification Search .......... 438/700
See application file for complete search history.

(56) References Cited

U.S. PATENT DOCUMENTS

| 5,672,241 | A | * | 9/1997 | Tien et al. | 438/701 |
| 5,780,356 | A | * | 7/1998 | Kim | 438/627 |
| 6,723,647 | B1 | * | 4/2004 | Kim et al. | 438/694 |
| 7,125,793 | B2 | * | 10/2006 | Liou et al. | 438/637 |
| 2003/0209726 | A1 | | 11/2003 | Shigeno | 257/200 |

FOREIGN PATENT DOCUMENTS

| JP | 2000-012863 | 1/2000 |
| JP | 2002-182241 | 6/2002 |

OTHER PUBLICATIONS

S. Rossnagel, Handbook of Plasma Processing Technology, (1990) Noyes Publications, p. 198.*

* cited by examiner

*Primary Examiner*—Nadine Norton
*Assistant Examiner*—Maki Angadi
(74) *Attorney, Agent, or Firm*—Jianq Chyun IP Office

(57) ABSTRACT

The present invention relates to a method for forming a contact opening. First, a substrate having at least a dielectric layer formed thereon is provided. Then, a photoresist layer having a first opening is formed on the dielectric layer. A plasma etching operation is performed to form a second opening in the dielectric layer, and the first opening is located above the second opening. The bottom part of the first opening has a diameter smaller than that of the top part of the second opening. Thereafter, the photoresist layer is removed from the dielectric layer. Accordingly, at least a portion of the exposed contact opening will not be oxidized to prevent an increase in the resistance between the conductive pattern and the conductive layer that fills in the contact opening.

14 Claims, 7 Drawing Sheets

METHOD FOR FORMING CONTACT OPENING

BACKGROUND OF THE INVENTION

1. Field of the Invention

The present invention relates to a semiconductor fabrication process. More particularly, the present invention relates to a method for forming a contact opening.

2. Description of the Related Art

FIGS. 1A through 1C are schematic cross-sectional views showing the steps in the conventional method for fabricating a contact opening in a thin film transistor (TFT). As shown in FIG. 1A, the thin film transistor 100 mainly comprises a gate 102, a gate insulation layer 104, a channel layer 106 and a source/drain 108. Furthermore, a protective layer 110 covers the source/drain 108 to prevent any damage to the source/drain 108 in subsequent processes. Through a contact opening (not shown in FIG. 1A), the source/drain 108 is electrically connected to other conductive layers for receiving signals from external circuits.

In the conventional method of fabricating the contact opening, a patterned photoresist layer 112 is formed on the protection layer 110. Then, as shown in FIG. 1B, the high oxygen-content plasma is used as the reactive ions (labeled 113 in FIG. 1B) to perform a reactive ion etching (RIE) operation to remove a portion of the protective layer 110 using the patterned photoresist layer 112 as a mask. Finally, as shown in FIG. 1C, the photoresist layer 112 is removed and a conical-shape contact opening 114 is formed in the protective layer 110. The contact opening 114 serves mainly to expose the source/drain 108.

At present, it is common to use a composite multi-layered metal structure of molybdenum layer 108a/aluminum layer 108b/molydenum layer 108c as the source/drain 108. However, the molybdenum layer 108a is easily etched away by the reactive ions used in the etching process of the protective layer 110 to expose the underlying aluminum layer 108b. When the aluminum layer 108b is exposed to the surrounding air, a layer of thin aluminum oxide layer will form on the surface of the aluminum layer 108b. This aluminum oxide film will lead to a higher resistance with the conductive layer subsequently deposited into the contact opening 114. Ultimately, the quality of signal transmission between the conductive layer and the source/drain 108 is deteriorated.

SUMMARY OF THE INVENTION

Accordingly, at least one objective of the present invention is to provide a method for forming a contact opening capable of resolving the prior problem of over-etching the conductive layer exposed by the contact opening and the resultant high contact resistance between the conductive layer and a subsequently deposited conductive layer that fills the contact opening.

To achieve these and other advantages and in accordance with the purpose of the invention, as embodied and broadly described herein, the invention provides a method for forming a contact opening. First, a substrate having at least a dielectric layer formed thereon is provided. Then, a photoresist layer having a first opening is formed over the dielectric layer. Thereafter, a plasma etching (PE) process is performed to form a second opening in the dielectric layer using the photoresist layer as a mask. The first opening is located above the second opening. Furthermore, the bottom part of the first opening has a diameter smaller than that of the top part of the second opening. Lastly, the photoresist layer is removed.

In one embodiment of the present invention, the aforementioned substrate further includes a conductive pattern formed thereon. Before performing the plasma etching operation, the dielectric layer covers the conductive pattern. The method of forming the conductive pattern includes, for example, forming a metallic layer and an anti-oxidation conductive layer in sequence over the substrate. Furthermore, the foregoing plasma etching operation includes removing a portion of the anti-oxidation conductive layer exposed by the first opening.

In one embodiment of the present invention, the anti-oxidation conductive layer is fabricated using molybdenum (Mo), molybdenum niobium (MoNb), molybdenum nitride (MoN) or titanium (Ti), for example.

In one embodiment of the present invention, the metallic layer is fabricated using aluminum or aluminum neodymium (AlNd), for example.

In one embodiment of the present invention, the operating pressure of the plasma etching process is greater than 150 mTorr (mT), for example.

In one embodiment of the present invention, before forming the conductive pattern over the substrate, a gate is formed on the substrate. Then, a gate insulation layer is formed over the substrate to cover the gate. Thereafter, a channel layer is formed over the gate insulation layer above the gate. The subsequently formed conductive pattern is disposed on the channel layer.

In one embodiment of the present invention, the channel layer is made of silicon, for example. Furthermore, before forming the conductive pattern, a conductive pad layer is formed over the channel layer such that the subsequently formed conductive pattern is disposed over the conductive pad layer. The conductive pad layer is fabricated using molybdenum, molybdenum niobium, molybdenum nitride or titanium, for example.

In one embodiment of the present invention, the substrate is a glass plate, for example. Furthermore, the method of forming the gate includes forming a metallic layer and an anti-oxidation conductive layer in sequence over the substrate, for example. The anti-oxidation conductive layer is fabricated using molybdenum, molybdenum niobium, molybdenum nitride or titanium, for example. The metallic layer is fabricated using aluminum or aluminum neodymium, for example.

In the present invention, at least a portion of the conductive pattern exposed by the contact opening will not be oxidized by oxygen in the surrounding air, and the resistance between the conductive pattern and the conductive layer inside the contact opening will not be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
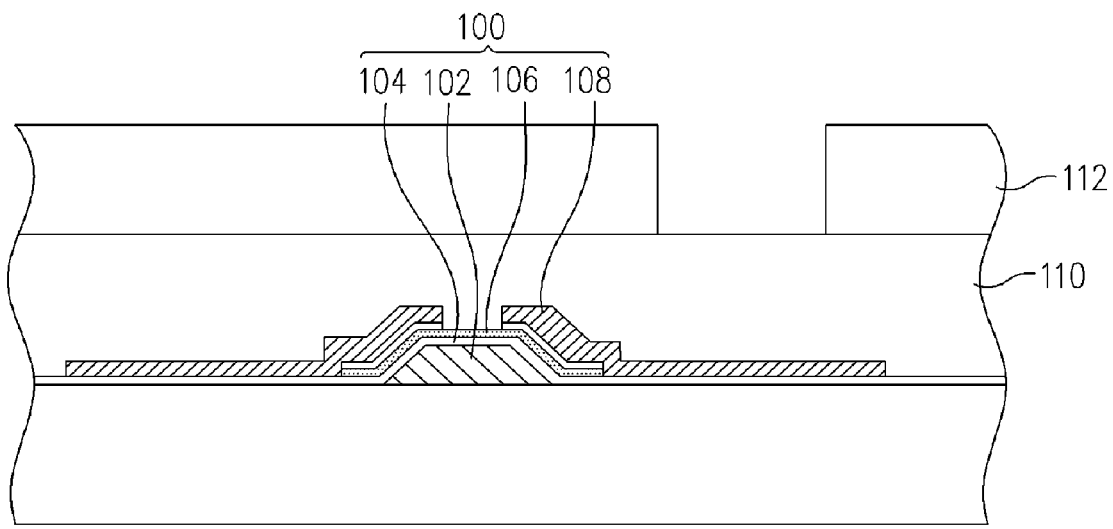
FIGS. 1A through 1C are schematic cross-sectional views showing the steps in the conventional method for fabricating a contact opening in a thin film transistor.
Figure 1B:
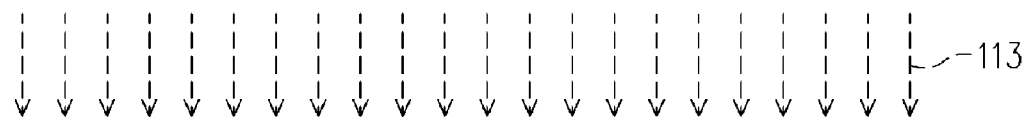
Figure 1B:
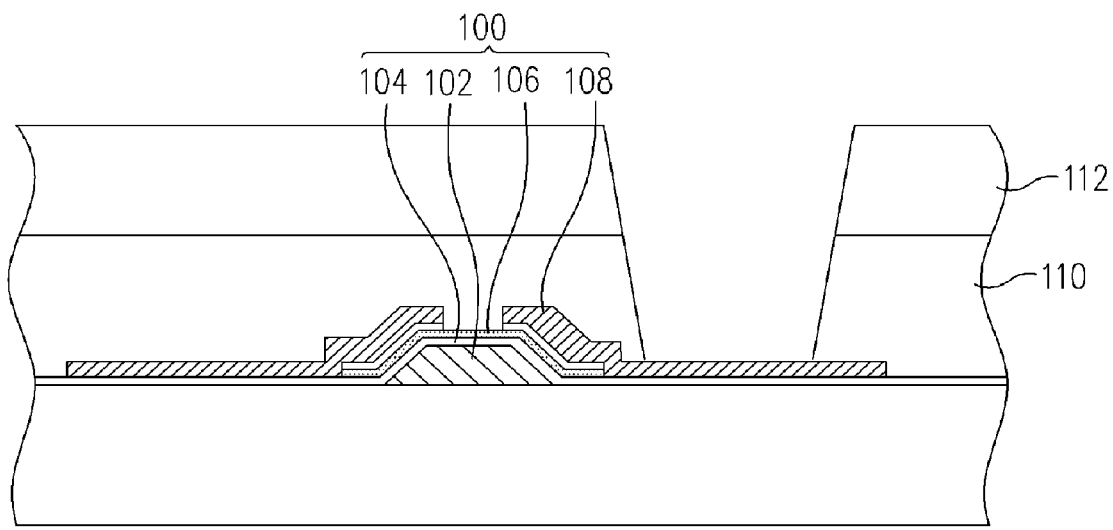
Figure 1C:
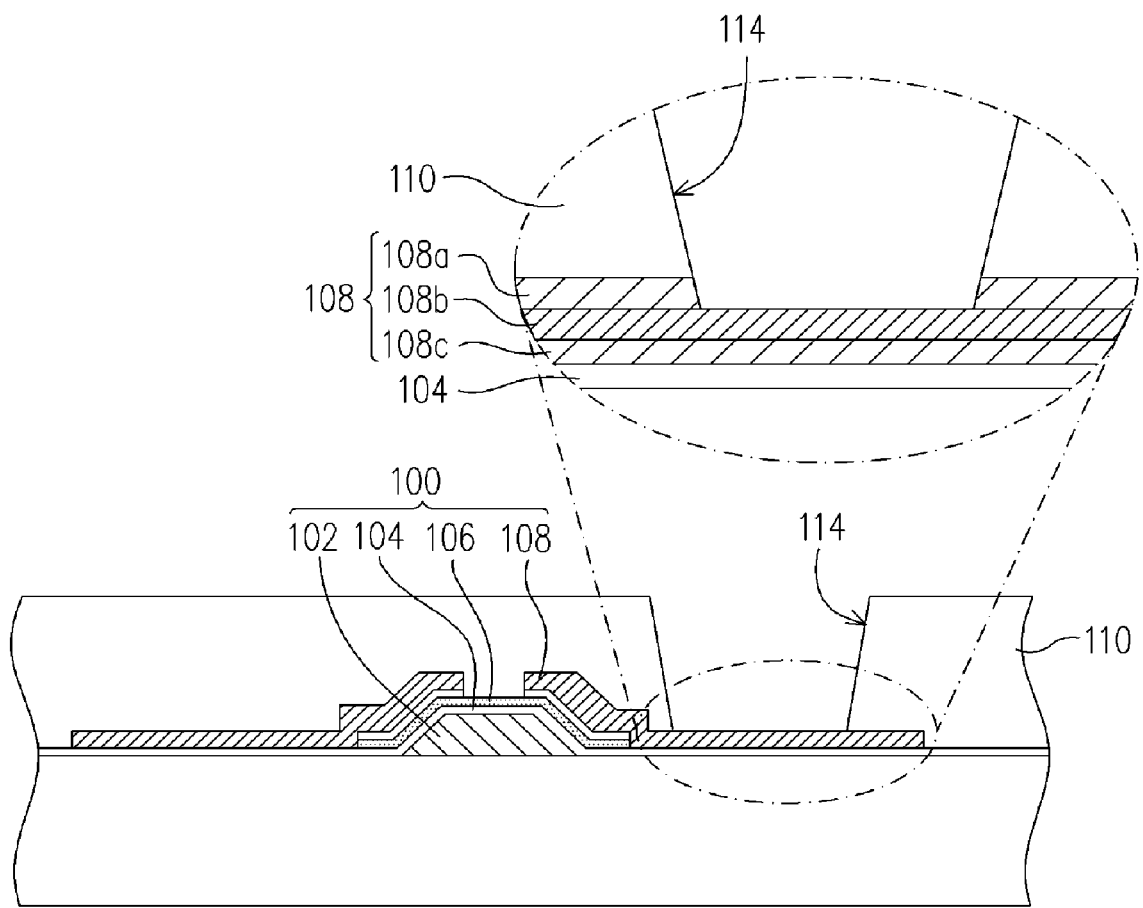

Reference will now be made in detail to the present preferred embodiments of the invention, examples of which are illustrated in the accompanying drawings. Wherever possible, the same reference numbers are used in the drawings and the description to refer to the same or like parts.

Figure 2A:
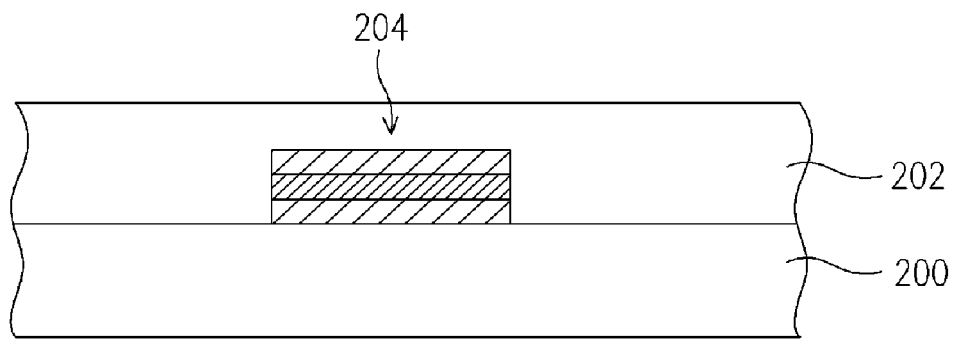
FIGS. 2A through 2C are schematic cross-sectional views showing the steps of the method for forming a contact opening according to one embodiment of the present invention.
Figure 2B:
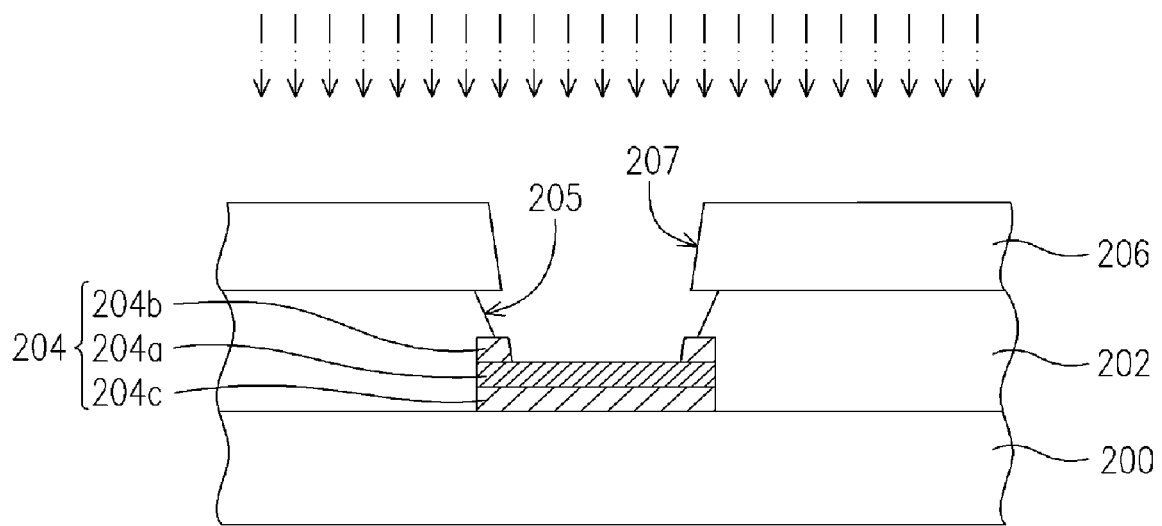
Figure 2C:
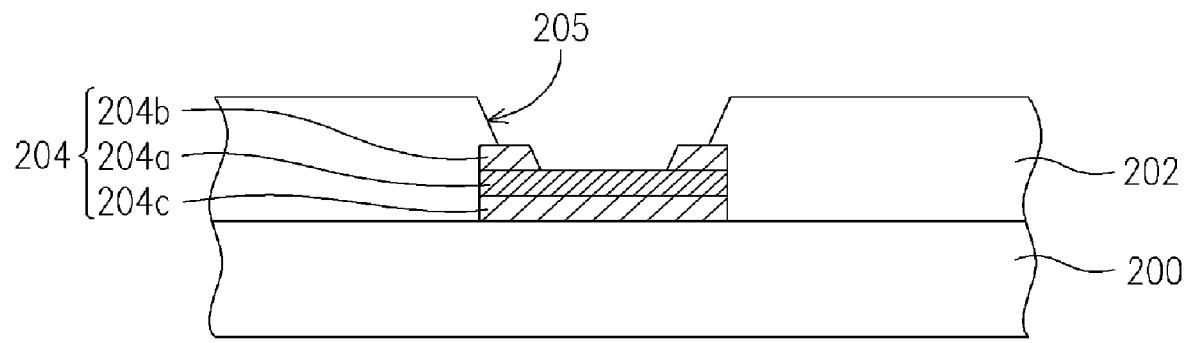

FIGS. 2A through 2C are schematic cross-sectional views showing the steps of the method for forming a contact opening according to one embodiment of the present invention. As shown in FIG. 2A, a substrate 200 is provided. The substrate 200 has at least a dielectric layer 202 formed thereon. Anyone familiar with the technique may notice that a contact opening is generally deployed to form an electrical connection between different conductive layers. Therefore, aside from the dielectric layer 202, a conductive pattern 204 is also formed over the substrate 200. Furthermore, the dielectric layer 202 covers the conductive pattern 204.

As shown in FIG. 2B, a photoresist layer 206 having a first opening 207 is formed over the dielectric layer 202. Then, using the photoresist layer 206 with the first opening 207 as a mask, a plasma etching operation is carried out to form a second opening 205 in the dielectric layer 202. Hence, the conductive pattern 204 is exposed. The operating pressure for carrying out the plasma etching operation is greater than 150 mTorrs, for example. Furthermore, the plasma etching operation actually includes both physical and chemical etching actions. Thus, the dielectric layer 202 is etched in the plasma etching process not only in the vertical direction but also in the horizontal direction.

In the plasma etching process of the present invention, after the reactive gas molecules have been dissociated into ions, the ions can react more readily with the dielectric layer 202 than the photoresist layer 206 to produce volatile compounds. Hence, even though some ions may react with the photoresist layer 206, the side etching mass of the dielectric layer 202 will be much greater than the side etching mass of the photoresist layer 206. In other words, the top part of the second opening 205 has a diameter greater than that of the bottom part of the first opening 207. The second opening 205 in the dielectric layer 202 is the contact opening.

As shown in FIG. 2C, the fabrication of the contact opening is finished after removing the photoresist layer 206 shown in FIG. 2B from the dielectric layer 202. If the conductive pattern 204 is a multi-layered film such as the metallic layer 204a and the anti-oxidation conductive layer 204b as shown in FIG. 2C, a portion of the anti-oxidation conductive layer 204b exposed by the first opening 207 will also be etched away in the plasma etching process in FIG. 2B. Hence, the metallic layer 204a will be exposed after the plasma etching process. On the contrary, the anti-oxidation conductive layer 204b that is still covered by the photoresist layer 206 will not be etched away. Because a portion of the anti-oxidation conductive layer 204b that is exposed by the second opening 205 is covered by the photoresist layer 206 (as shown in FIG. 2B), only a portion of the metallic layer 204a will be exposed at the completion of the plasma etching process.

Figure 3:
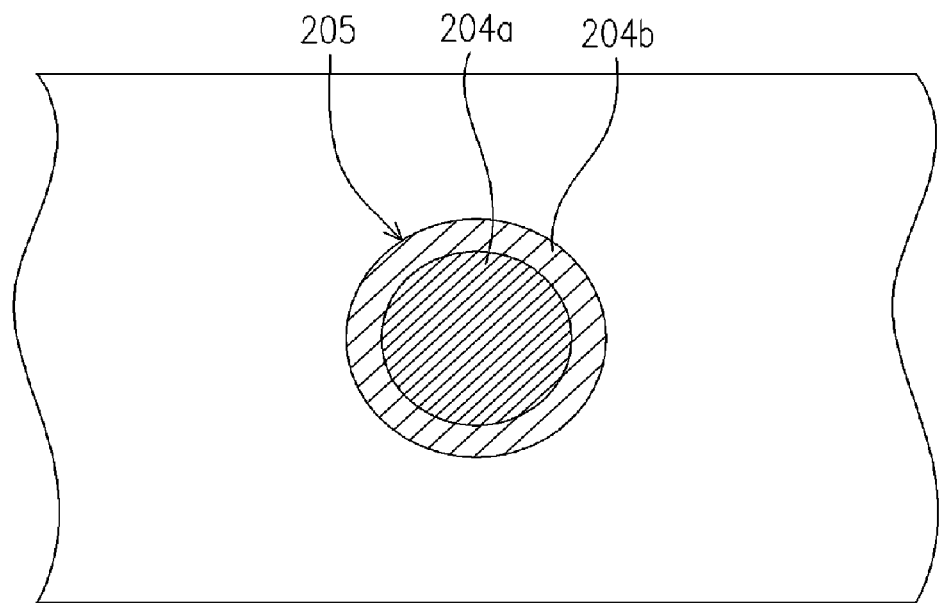
FIG. 3 is a top view of FIG. 2C.

For example, the first opening 207 and the second opening 205 can have a circular cross-sectional profile from the top view. Hence, from the top view, the contact opening formed according to the present embodiment exposes a donut-shaped conductive pattern as shown in FIG. 3. The outer ring (donut-shaped) is the anti-oxidation conductive layer 204b and the inner ring (disk-like) is the metallic layer 204a. Obviously, in other embodiments, the first opening 207 and the second opening 205 can have a cross-sectional profile of some other geometric shapes (not shown). In a subsequent process, a conductive layer (not shown) is formed over the dielectric layer 202, and the conductive layer fills up the contact opening (that is, the second opening 205). As a result, the metallic layer 204a and the anti-oxidation conductive layer 204b of the conductive pattern 204 are electrically connected with the subsequently formed conductive layer.

To familiarize the advantages of the present invention, a method of forming a contact opening in a thin film transistor is described in the following. The method serves as an illustrative purpose only and should by no means limit the scope of the present invention as such.

Figure 4A:
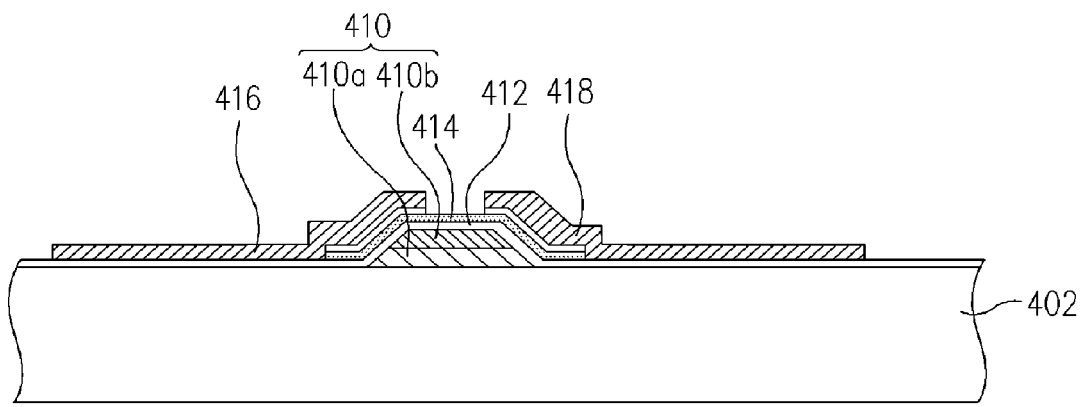
FIGS. 4A through 4C are schematic cross-sectional views showing the steps of the method for forming a contact opening in a thin film transistor according to one embodiment of the present invention.
Figure 4B:
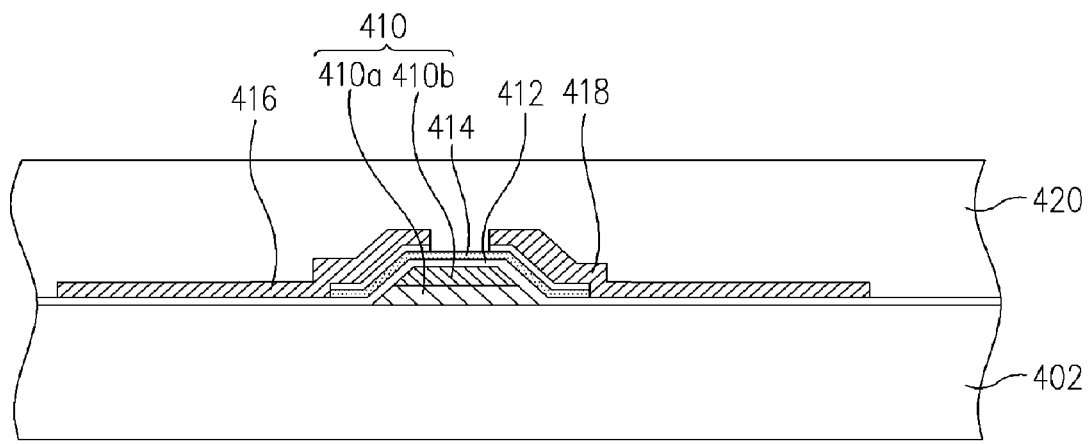
Figure 4C:
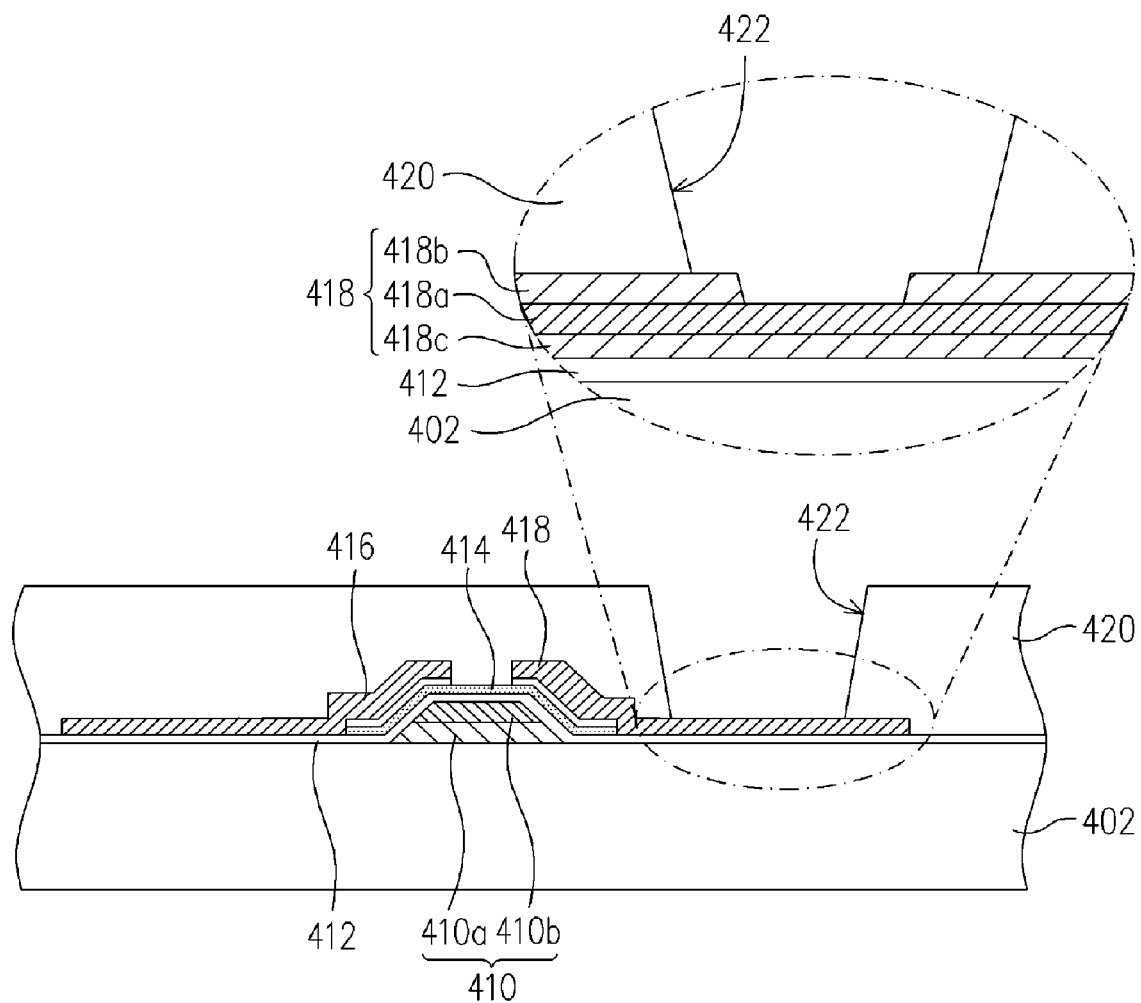

FIGS. 4A through 4C are schematic cross-sectional views showing the steps of the method for forming a contact opening in a thin film transistor according to one embodiment of the present invention. As shown in FIG. 4A, a gate 410, a gate insulation layer 412, a channel layer 414, a source 416 and a drain 418 are sequentially formed over a substrate 402. The substrate 402 is a glass plate or panel, for example. The gate 410 is a composite layer comprising a metallic layer 410a and an anti-oxidation conductive layer 410b, for example. Obviously, the gate 410 can be a single layer or a composite layer having more than two layers. There is no particular limitation in this particular area of the invention.

In the present embodiment, the metallic layer 410a is fabricated using aluminum (Al) or aluminum neodymium (AlNd), for example, so that the gate 410 can have a higher conductivity. The anti-oxidation conductive layer 410b is formed on the metallic layer 410a. Furthermore, the anti-oxidation conductive layer 410b is less active than the metallic layer 410a, so that the anti-oxidation conductive layer 410b can protect the metallic layer 410a against oxidation with oxygen molecules in the air. In other words, by preventing the oxidation of the metallic layer 410a, an increase in the resistance of the gate 410 is avoided. Here, the anti-oxidation conductive layer 410b can be fabricated using molybdenum (Mo), molybdenum niobium (MoNb) or titanium (Ti), for example.

As shown in FIG. 4B, a protective layer 420 is formed over the substrate 402 to cover the source 416 and the drain 418. Up to this stage, the fabrication of the thin film transistor 400 is almost finished. However, one skilled in the art may notice that the gate 410, the source 416 and the drain 418 of the thin film transistor 400 are frequently electrically connected to other conductive layers. As a result, external circuits can transmit signals to the gate 410, the source 416 and/or the drain 418 to drive the thin film transistor 400, through the conductive layers. Using an active-driven liquid crystal display panel as an example, the gate, the source and the drain of a thin film transistor within the panel are electrically connected to a scan line, a data line and a pixel electrode respectively. The gate and the scan line belong to the same film layer. Similarly, the source and the data line belong to the same film layer. However, the pixel electrode and the drain are located in different film layers. Hence, the pixel electrode is electrically connected with the drain of the thin film transistor through a contact opening.

Accordingly, as shown in FIG. 4C, a contact opening 422 that exposes the drain 418 is formed in the protective layer 420. In the present embodiment, the method of forming the contact opening 422 is identical to the process described in the aforementioned embodiment and will not be described in details again. The drain 418 can be considered assimilar to the conductive pattern 204 in the aforementioned embodiment and the protective layer 420 can be considered as similar to the dielectric layer 202 in the aforementioned embodiment.

Obviously, the source 416 and the drain 418 can also be a composite layer having two or more than two layers. In the present embodiment, the drain 418 comprises a metallic layer 418a and an anti-oxidation conductive layer 418b, for example. The metallic layer 418a is fabricated using aluminum (Al) or aluminum neodymium (AlNd) and the anti-oxidation conductive layer 418b is fabricated using molybdenum (Mo), molybdenum niobium (MoNb), molybdenum nitride (MoN) or titanium (Ti), for example.

In addition, because the aluminum can easily dissolve in silicon and the channel layer 414 is made of silicon, a conductive pad layer 418c is formed between the channel layer 414 and the metallic layer 418a to prevent the aluminum from contacting with the silicon. The conductive pad layer 418c is fabricated using molybdenum (Mo), molybdenum niobium (MoNb), molybdenum nitride (MoN) or titanium (Ti), for example.

Figure 5:
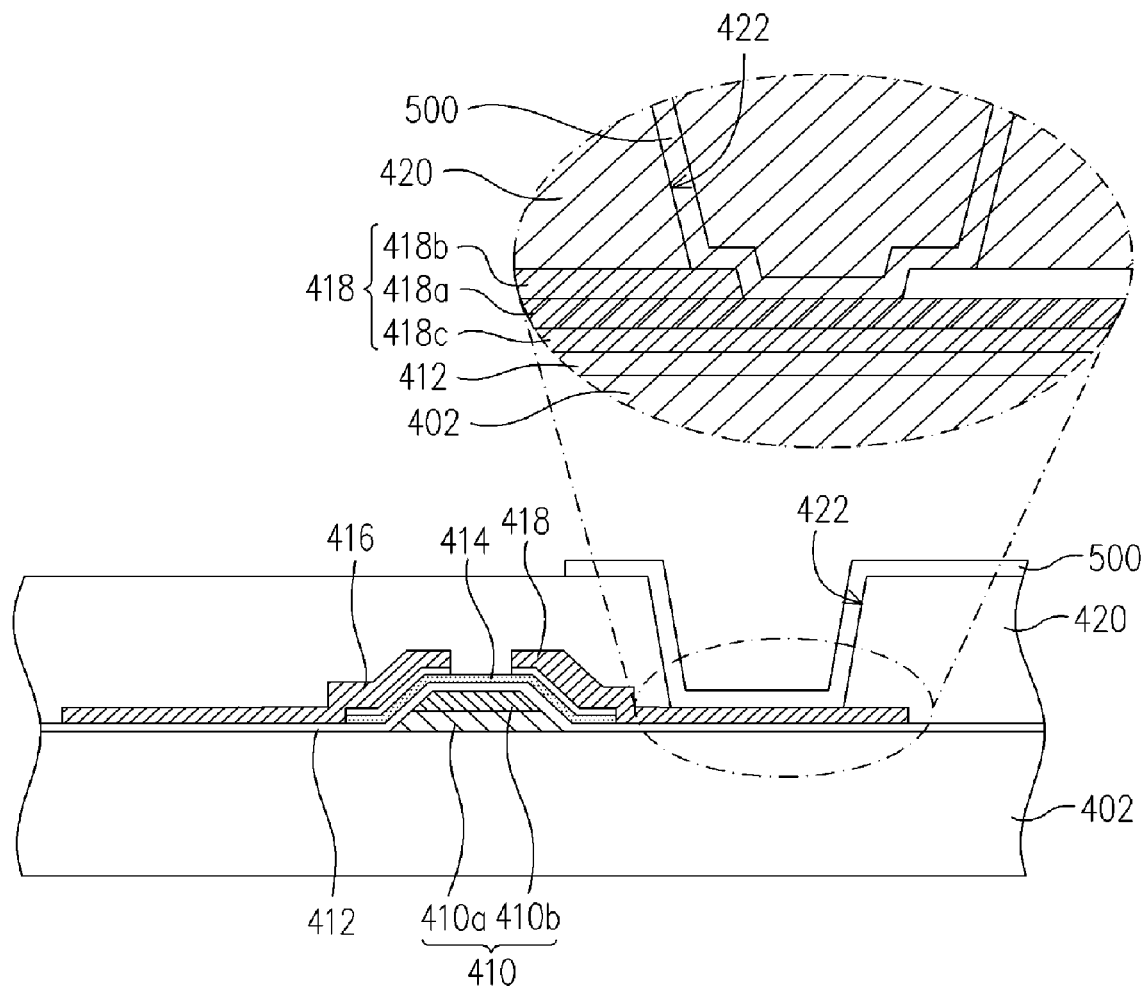
FIG. 5 is a schematic cross-sectional view showing a pixel electrode formed inside the contact opening of FIG. 4C according to one embodiment of the present invention.

As can be seen in the foregoing description, the drain 418 exposed by the contact opening 422 has a shape similar to that of the conductive pattern 204 shown in FIG. 3. For the drain 418, the outer ring (donut) is the anti-oxidation conductive layer 418b and the inner ring (disk) is the metallic layer 418a. Furthermore, a pixel electrode 500 (see FIG. 5) is subsequently formed over the protective layer 420 and in the contact opening 422, and electrically connects with the anti-oxidation conductive layer 418b and the metallic layer 418a simultaneously. Thus, even if a metallic oxide film is formed on the surface due to the oxidation of the metallic layer 418a in an open environment, resistance between the pixel electrode 500 and the drain 418 will not be increased significantly due to the electrical connection between the pixel electrode 500 and the anti-oxidation conductive layer 418b.

In summary, the method of forming the contact opening in the present invention includes using a high-pressure plasma etching process to pattern the dielectric layer. The side etching amount of the dielectric layer by the plasma etching process is greater than that of the photoresist layer. As a result, at least a portion of the conductive pattern exposed by the contact opening will not be oxidized by the oxygen in the air. Therefore, an increase in the resistance between the conductive pattern and the conductive layer filling into the contact opening can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a contact opening, comprising the steps of:
    providing a substrate, wherein the substrate has a conductive pattern and at least a dielectric layer covering the conductive pattern formed thereon, and the conductive pattern comprises a metallic layer and an anti-oxidation conductive layer over the metallic layer;
    forming a photoresist layer over the dielectric layer, wherein the photoresist layer has a first opening;
    performing a plasma etching process to form a second opening in the dielectric layer using the photoresist layer as a mask, wherein the first opening is located above the second opening, and a bottom part of the first opening has a diameter smaller than that of a top part of the second opening, and the anti-oxidation conductive layer exposed by the first opening is removed in the plasma etching process; and
    removing the photoresist layer,
    wherein the anti-oxidation conductive layer in the second opening surrounds the metallic layer from the top view.

2. The method of claim 1, wherein a material constituting the anti-oxidation conductive layer includes molybdenum, molybdenum niobium, molybdenum nitride or titanium.

3. The method of claim 1, wherein a material constituting the metallic layer includes aluminum or aluminum neodymium.

4. The method of claim 1, wherein an operating pressure of the plasma etching process is greater than 150 mTorrs.

5. A method of forming a device on a substrate, comprising:
    forming a gate over the substrate;
    forming a gate insulation layer over the substrate to cover the gate;
    forming a channel layer over the gate insulation layer above the gate;
    forming a source and a drain over the channel layer, wherein the source and the drain are a composite layer comprising a metallic layer and an anti-oxidation conductive layer over the metallic layer;
    forming a protective layer over the substrate to cover the source and the drain;
    forming a photoresist layer over the protective layer, wherein the photoresist layer has an opening over the drain;
    performing a plasma etching process to form a contact opening in the protective layer layer using the photoresist layer as a mask, wherein the opening is located above the contact opening, and a bottom part of the opening has a diameter smaller than that of a top part of the contact opening, and the anti-oxidation conductive layer of the drain exposed by the opening is removed in the plasma etching process;
    removing the photoresist layer, and the anti-oxidation conductive layer of the drain in the contact opening surrounds the metallic layer of the drain from the top view; and
    forming a pixel electrode on the protective layer, wherein the pixel electrode fills into the contact opening and electrically contacts with the anti-oxidation conductive layer and the metallic layer of the drain.

6. The method of claim 5, wherein a material constituting the channel layer includes silicon.

7. The method of claim 6, before forming the conductive pattern, further comprising forming a conductive pad layer over the channel layer and the subsequently formed source and drain are located on the conductive pad layer.

8. The method of claim 7, wherein a material constituting the conductive pad layer includes molybdenum, molybdenum niobium, molybdenum nitride or titanium.

9. The method of claim 5, wherein the substrate includes a glass panel.

10. The method of claim 9, wherein the step of forming the gate includes forming a metallic layer and an anti-oxidation conductive layer in sequence over the substrate.

11. The method of claim 10, wherein a material constituting the anti-oxidation conductive layer includes molybdenum, molybdenum niobium, molybdenum nitride or titanium.

12. The method of claim 10, wherein a material constituting the metallic layer includes aluminum or aluminum neodymium.

13. The method of claim 1, wherein the anti-oxidation conductive layer surrounds the metallic layer from the top view to form a donut-shaped pattern in the second opening.

14. The method of claim 5, wherein the anti-oxidation conductive layer surrounds the metallic layer from the top view to form a donut-shaped pattern in the contact opening.

* * * * *